United States Patent [19]

Matsumoto et al.

[11] Patent Number: 4,727,043

[45] Date of Patent: Feb. 23, 1988

[54] METHOD OF MANUFACTURING A NON-VOLATILE MEMORY

[75] Inventors: Takashi Matsumoto, Kawasaki; Motoo Nakano, Yokohama, both of Japan

[73] Assignee: Fujitsu Limited, Kawasaki, Japan

[21] Appl. No.: 792,238

[22] Filed: Oct. 29, 1985

Related U.S. Application Data

[63] Continuation of Ser. No. 699,229, Feb. 7, 1985, abandoned, which is a continuation of Ser. No. 583,782, Feb. 29, 1984, abandoned, which is a continuation of Ser. No. 333,813, Dec. 23, 1981, abandoned.

[30] Foreign Application Priority Data

Dec. 29, 1980 [JP] Japan .............................. 55-187914

[51] Int. Cl.[4] .................. H01L 21/265; H01L 21/283
[52] U.S. Cl. ........................................ 437/29; 437/43; 437/52; 437/193; 437/23.5
[58] Field of Search .................. 29/571, 576 B, 578; 148/1.5; 357/23.5, 59, 91; 427/93; 437/28, 29, 43

[56] References Cited

U.S. PATENT DOCUMENTS

| | | |
|---|---|---|
| 4,203,158 | 5/1980 | Frohman-Bentchkowsky et al. ........................................ 365/185 |
| 4,302,766 | 11/1981 | Gutterman et al. .................. 437/43 |
| 4,361,847 | 11/1982 | Harari ............................ 357/59 X |

OTHER PUBLICATIONS

Carter, G. et al., *Ion Implanatation of Semiconductors,* John Wiley & Sons, New York, 1976, pp. 193-194.
Scheibe et al., "Technology of . . . SIMOS", in *IEEE Transactions on Electron Devices,* vol. ed. 24, No. 5, May 1977, pp. 600-606.
Rössler, B., "Electrically Erasable . . . SIMOS One-Transistor Cell", in *IEEE Trans. on Electron Devices,* 24(5), May '77, pp. 606-610.
Beyer et al, "Reduction of Oxidation-Induced Defects Using Reactive Ion Etching", IBM Tech. Discl. Bulletin, vol. 22, #2, 7/79.

*Primary Examiner*—Brian E. Hearn
*Assistant Examiner*—Tom Thomas
*Attorney, Agent, or Firm*—Staas & Halsey

[57] ABSTRACT

An improved electrically alterable read-only memory (EAROM) is offered by the method of the invention, the memory device comprising a floating gate type field effect transistor in which a part of the floating gate and a part of the drain region formed in a silicon substrate overlap. According to the method, impurity atoms are ion implanted into a part of a region where the drain region is to be formed through an insulation layer of silicon dioxide on the region. Thereafter, the insulation layer through which ion implantation was carried out is removed and a fresh insulation layer of silicon dioxide is formed where the old insulation layer was removed. By this method, a good, thin insulation film is fabricated. By virtue of the fresh insulation layer devoid of trap centers which trap electric charges, the insulation layer is free from defects that interrupt flow of electrons required for writing or erasing of information.

2 Claims, 16 Drawing Figures

METHOD OF MANUFACTURING A NON-VOLATILE MEMORY

This is a continuation of co-pending application Ser. No. 699,229 filed on Feb. 7, 1985, which is a continuation of application Ser. No. 583,782, filed Feb. 29, 1984, which is a continuation of application Ser. No. 333,813, filed on Dec. 23, 1981, all abandoned.

BACKGROUND OF THE INVENTION

This invention is directed at a method of manufacturing a non-volatile memory or storage, and more particularly to an improved method of manufacturing an electrically alterable read-only memory (EAROM) comprising a floating gate type field effect transistor wherein a part of the region of the floating gate and a part of the drain region overlap.

A memory of the kind just described has been generally known, and one example thereof is shown as a plan view in FIG. 1A and as a cross-sectional view in FIG. 1B taken along the line B—B of FIG. 1A. In these figures, a p-type silicon (Si) substrate 1 is illustrated along with a source region 2, enclosed by a dotted line, which is doped $n^+$-type and connected to a grounding terminal not shown. A drain region 3, also enclosed by a dotted line, is similarly doped $n^+$-type and connected to a bit line 4 made of aluminum (Al) wiring. A control gate 5 of polycrystalline silicon constitutes a word line 6. A floating gate 7 of polycrystalline silicon has a region which overlaps the control gate 5 and a region that overlaps the drain region 3 as illustrated in FIG. 1C which is a cross-sectional view taken along the line C—C of FIG. 1A. In these figures, the reference numerals 8, 9 and 10 denote insulation layers respectively.

In writing information into a non-volatile storage as depicted, electric voltage is applied to the word line 6 and bit line 4 respectively, and by utilizing tunnel effect, electrons in the drain region 3 are caused to be injected into the floating gate 7 where the electrons are accumulated. When reading the information, electric voltage is applied to the word line 6 and the bit line 4 to address, and current flows to the bit line 4 if electrons are accumulated in the floating gate 7 and the information has been written therein, and thus the information may be read. In order to erase the information, that is for the purpose of driving out the electrons accumulated in the floating gate 7, an electric voltage that is the reverse to the voltage applied for to write the information is applied to the word line 6 and bit line 4, and taking advantage of the tunnel effect, electrons are driven to that part of the drain region 3 overlapping the floating gate 7.

In a non-volatile memory device which functions as described above, the characteristics of an insulation layer where the floating gate 7 and the drain region 3 overlap greatly influence important characteristics of the memory such as retention and loss of the stored data. Electric charges pass through the insulation layer to enable writing and reading of data. If electric charges are trapped in the insulation layer and remain there, the insulation layer remains at a certain level of electric potential. Depending on the sign of the potential, the stored data is either difficult to erase or easily lost. This may place limitations on the frequency or number of times information may be written.

SUMMARY OF THE INVENTION

It is therefore a general object of the invention to offer an improved method of manufacturing an electrically alterable non-volatile memory or storage device comprising a floating gate type field effect transistor in which a part of a floating gate overlaps a part of a drain region.

In order to achieve the above object, impurity atoms are introduced into a part of the region in the substrate where the drain region is to be formed through an insulation layer formed on the substrate, thereafter the insulation layer on the part of the region where the drain region is to be made is removed, then an insulation film is formed afresh on the above-described part, after which the floating gate is patterned and fabricated on a region including the above-described part.

The above and further objects and novel features of the invention will appear more fully from the following detailed description when read in connection with the accompanying drawings. It is to be expressly understood, however, that the drawings are not intended as a definition of the invention but are for the purpose of illustration only.

DESCRIPTION OF THE PREFERRED EMBODIMENT

Each process to carry out the method of the present invention will next be explained in order to elucidate the structure and unique effect of the invention, taking as an example a p-type doped silicon substrate on which an EAROM is fabricated.

A first process is to prepare device separation regions. That is, an insulation layer of silicon dioxide ($SiO_2$) 0.5 to 1.0 μm thick is formed by a conventional thermal oxidation on the surface of a silicon wafer which is doped p-type, 1 to 20 Ωcm for example.

Figure 2:
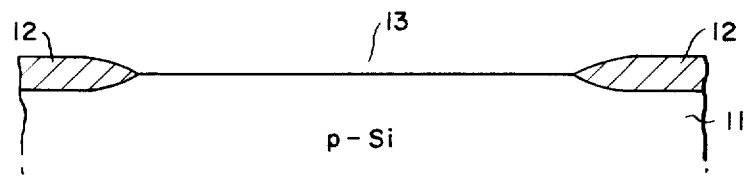
FIG. 2 is a cross-sectional view of a portion of a wafer after finishing a first process of the method of the present invention for the manufacture of an electrically alterable non-volatile memory comprising a floating gate type field effect transistor in which a part of the floating gate and a part of the drain region overlap.

Thereafter, a film of photoresist emulsion, not shown, is coated on the entire surface of the wafer. Next, by a conventional photolithographic process, the photoresist film is patterned, and the insulation layer is selectively removed. FIG. 2 shows a substrate 11 of the wafer when the above process is over, with the insulation layers 12 and an area 13 where the memory device is to be fabricated.

The insulation layer may be fabricated by a conventional local oxidation of silicon (LOCOS) using silicon nitride film.

Figure 3:
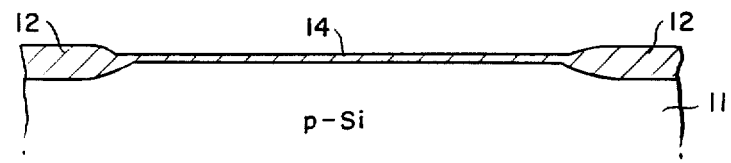
FIG. 3 is a cross-sectional view of the portion of the wafer after a second process of the method of the present invention is completed.

A second process, which is carried out after removing the photoresist film, involves fabrication of an insulation layer 14 which is 200 to 500 Å thick on the area 13 where the memory device is to be fabricated by a heat treatment at 1100° C. for 20 to 30 minutes in an atmosphere of dry oxygen. FIG. 3 depicts the substrate 11 when the second process is finished to provide the thin, good insulation layer 14.

Figure 4A:
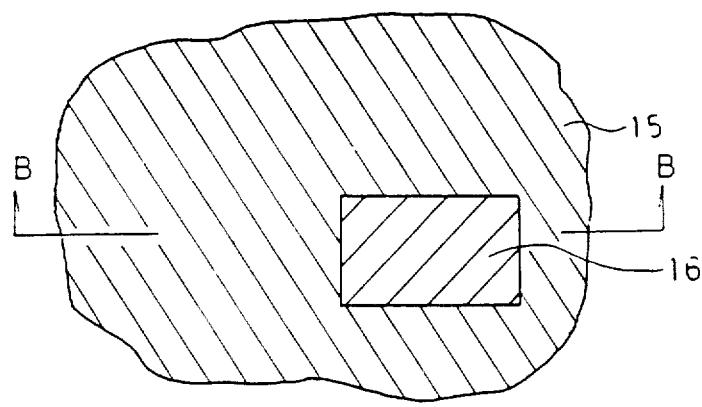
FIG. 4A is a plan view of the portion of the wafer after finishing a third process of the method of the present invention.
Figure 4B:
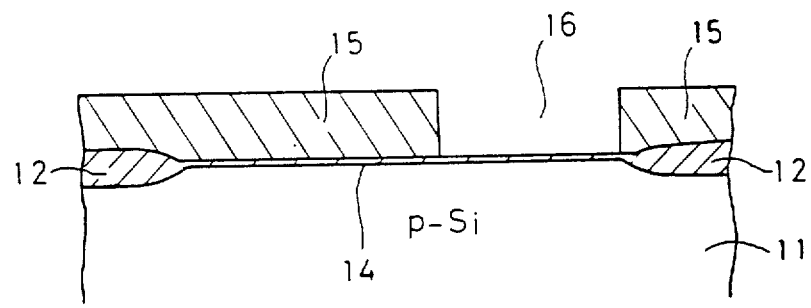
FIG. 4B is a cross-sectional view taken along the line B—B of FIG. 4A.

In a third process, photoresist emulsion is coated, 1 to 2 μm thick, on the entire surface of the wafer by a known technique, and through a conventional photolithographic process, part of the photoresist emulsion is removed from a region where a floating gate and a drain region are to overlap. The wafer, after this process is carried out, is depicted in a plan view of FIG. 4A and a cross-sectional view of FIG. 4B taken along the line B—B of FIG. 4A. In these figures, the reference numeral 15 denotes a film of photoresist emulsion, and 16 a region where the floating gate and the drain region are to overlap.

In a fifth process, $5 \times 10^{14}$ to $1 \times 10^{16}$ cm$^{-2}$ donor atoms, for example arsenic (As) atoms are implanted at 50 to 200 KeV through the insulation layer 14 into the region 16 where the floating gate and the drain region will overlap. The reason why arsenic ion is implanted through the insulation layer 14 is that, if arsenic ion is introduced directly into the silicon substrate, and the insulation layer of silicon dioxide is formed subsequent thereto, it will have a number of arsenic ions which form trap centers to trap electrons. This increases leak current.

Figure 5:
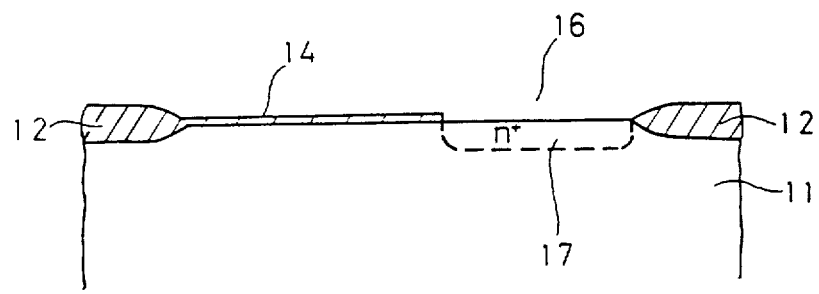
FIG. 5 is a cross-sectional view of the portion of the wafer after a sixth process of the method of the present invention is finished.

A sixth process involves selective removal by means of a photolithographic technique of the part 16 of the insulation layer 14 where the floating gate and the drain region are to overlap. The wafer, when this process is finished, is depicted in the cross-section view of FIG. 5, wherein the reference numeral 17 denotes an n$^+$-type region. As will be noted, a part of the insulation layer 14 has been removed from above this n$^+$-type region. The insulation layer 14 may be removed by a conventional etching technique using hydrofluoric acid etchant so as not to damage the surface of silicon substrate in the n$^+$-type region 17.

Through a seventh process, a good insulation layer 19 of silicon dioxide ($SiO_2$), 100 to 200 Å thick, devoid of trap centers described before, is formed on the region 16 of the n$^+$-type region 17 by a conventional thermal oxidation. This process is an essential feature of the method of the invention since, by the process, a good insulation layer serving to improve the chracteristics of an EAROM is offered.

Figure 6A:
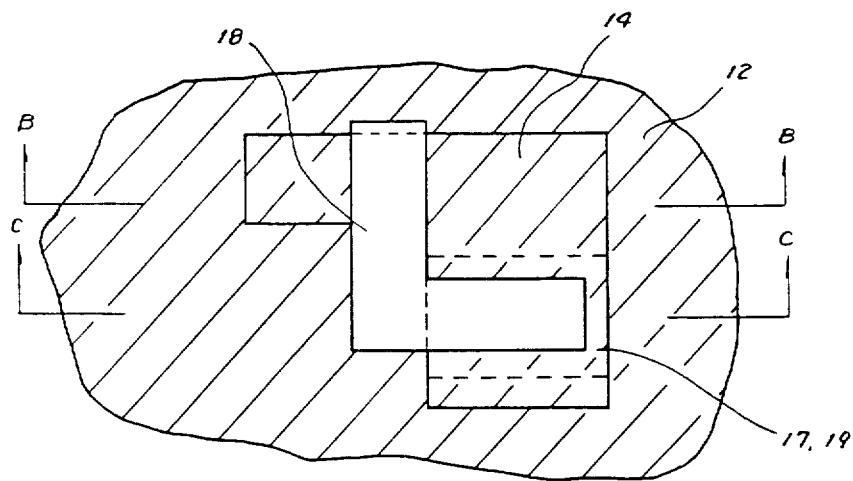
FIG. 6A is a schematic plan view of the portion of the wafer after an eighth process of the method of the present invention is completed.
Figure 6B:
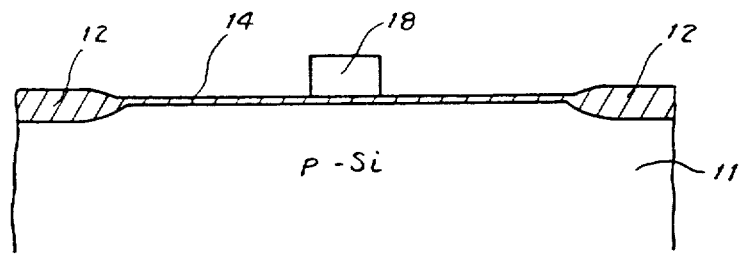
FIGS. 6B and 6C are cross-sectional views taken along the lines B—B and C—C of FIG. 6A respectively.
Figure 6C:
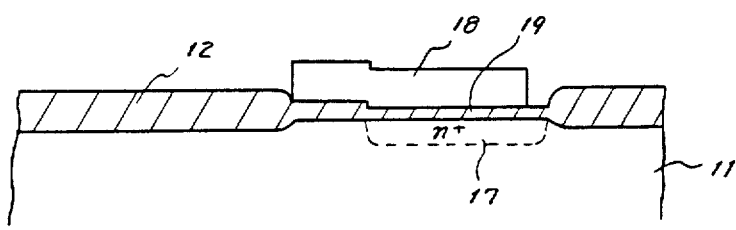

An eighth process involves a selective fabrication of a layer of doped polycrystalline silicon by chemical vapour phase deposition, for example, to form a floating gate. The wafer, after this process has been carried out, is shown in FIG. 6A in a plan view. FIGS. 6B and 6C are cross-sectional views of the wafer taken along the lines B—B and C—C of FIG. 6A respectively. In these figures, the reference numeral 18 denotes the floating gate made of doped polycrystalline silicon, with one part thereof formed on the insulation layer 14 and other part on the good, thin insulation layer 19 on the n$^+$-type region 17.

A ninth process is a step wherein an insulation layer 20 of silicon dioxide is formed by a known thermal oxidation on the surface of the floating gate 18.

In a tenth process, a control gate 21 of polycrystalline silicon is selectively fabricated on the floating gate 18 and an area where a word line will be formed.

Figure 1A:
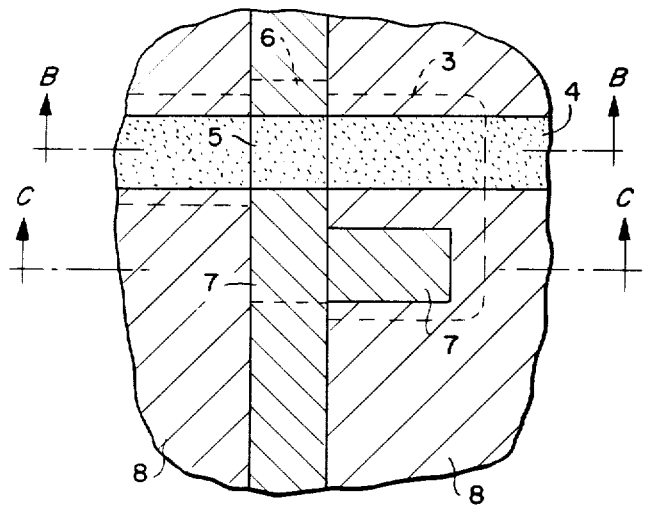
FIG. 1A is a plan view of a non-volatile memory according to the prior art.
Figure 1B:
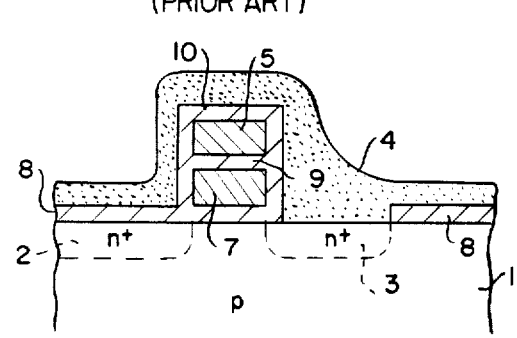
FIGS. 1B and 1C are cross-sectional views taken along the lines B—B and C—C of FIG. 1A respectively.
Figure 1C:
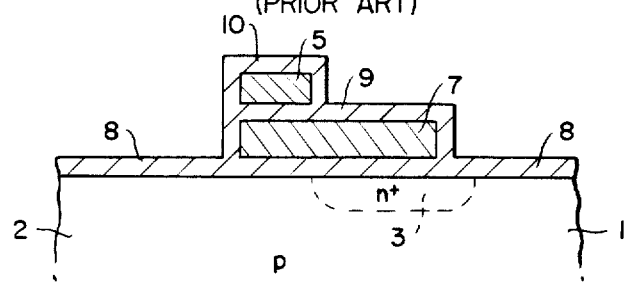
Figure 7A:
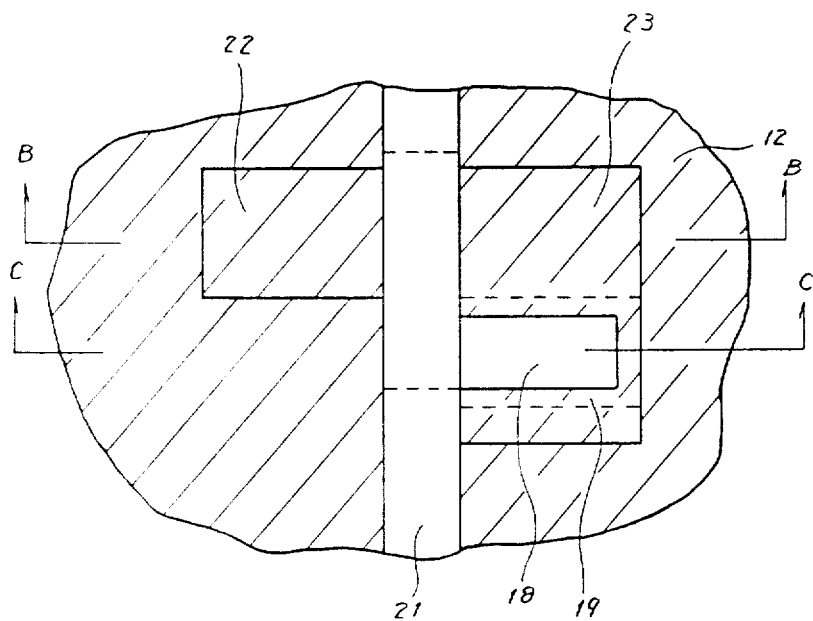
FIG. 7A is a schematic plan view of the portion of the wafer after finishing an eleventh process of the method of the present invention is over.
Figure 7B:
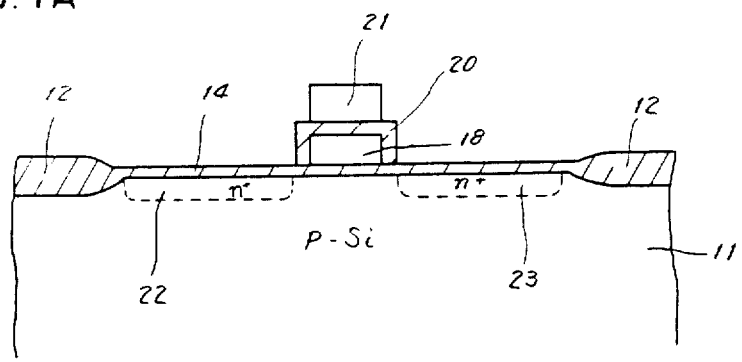
FIGS. 7B and 7C are cross-sectional views taken along the lines B—B and C—C of FIG. 7A respectively.
Figure 7C:
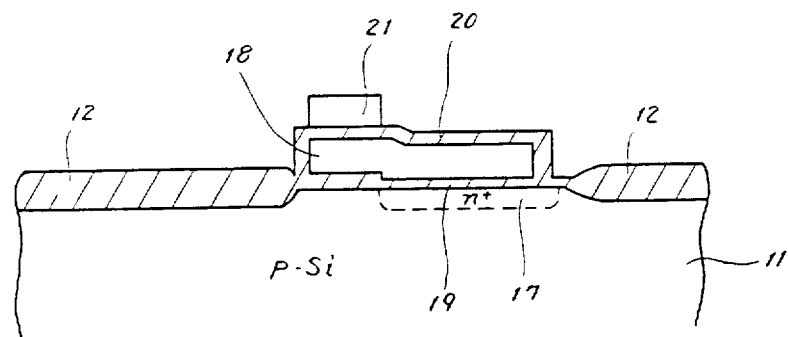

And an eleventh process involves introducing donor atoms, such as arsenic atoms, by a known ion implantation process into the source and drain regions excepting the n$^+$-type region 17. A plan view of the wafer, after this process is finished, is shown in FIG. 7A, and in FIGS. 7B and 7C which are cross-sectional views taken along the lines B—B and C—C of FIG. 7A respectively. In these figures, the reference numeral 20 denotes the insulation layer formed in the seventh process, 21 the control gate which also functions as the word line, 22 the source region (enclosed by a dotted line), 23 the n$^+$-type region (enclosed also by a dotted line) formed by the eleventh process which, together with the n$^+$-type region 17 formed in the fifth process, form the drain region. It should be noted, however, that although the upper layer on the n$^+$-type region 23 is the old insulation layer 14, an upper layer on the n$^+$-type region 17 is the good, thin insulation layer 19. FIGS. 7A and 7C are substantially the same as FIGS. 1A, 1B and 1C, but there is an important difference that the insulation layer 19 forming the upper layer of the n$^+$-type region 17 was formed afresh after completion of the ion implantation.

Thereafter, an electrically alterable read-only memory (EAROM) comprising a floating gate type field effect transistor is fabricated employing a known technique. That is, the entire surface of the wafer, including the control gate 21, is insulated by phospho-silicate-glass (PSG). The film of PSG and the film 14 of silicon dioxide on the region 23 in the drain region are selectively removed, electrodes and wirings including the bit line are fabricated by conventional means, such as vapour deposition of aluminum, patterning of the aluminum layer by photolithographic technique, and coating of suitable known material to form a surface protection film.

Figure 8:
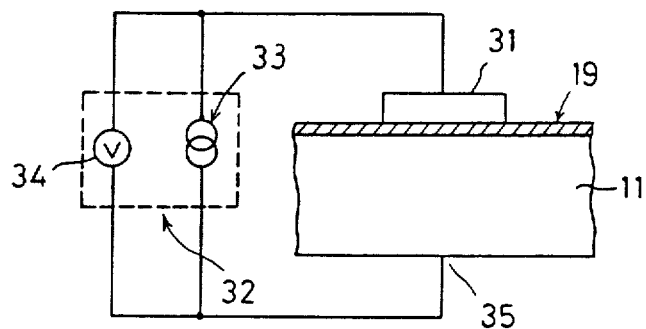
FIG. 8 is a schematic view of a device to test the insulation layer formed according to the present invention.

The quality of the insulation layer 19 formed according to the present invention was examined using a device schematically illustrated in FIG. 8. A contact 31, in electrical contact with the insulation layer 19, is connected to an electrometer 32 comprising a constant current source 33 generating constant current of $3.5 \times 10^{-7}$ A/cm$^2$, and a voltmeter 34. The electrometer 32 in turn is connected to a contact 35 at the other side of the contact 31. By causing constant current to flow through the shown circuit, the voltage between the contacts 31 and 35 is read. If this voltage remains constant, it will show that there are no undesirable charges trapped in the insulation layer 19.

Figure 9:
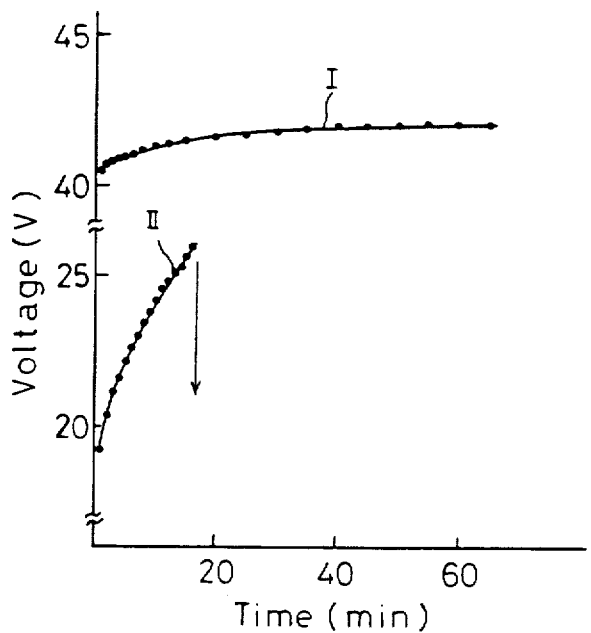
FIG. 9 graphically illustrates the result of tests conducted on the insulation layers formed according to the prior art and the present invention, respectively.

FIG. 9 is a diagram showing time (in minutes) vs. voltage (V) where the insulation layers according to the invention and prior art are tested. In the diagram, curve I traces values of voltage where the insulation layer 19 of the invention was tested, curve II those where the prior art insulation layer was tested. As explained before, the prior art insulation layer was formed after ion implantation of arsenic onto the exposed surface of the silicon wafer.

Excepting the initial phase soon after the constant current began flowing, constant voltage with very little change was noted with the insulation layer 19. Whereas with the prior art insulation layer, voltage was low in the initial phase, rose rather sharply, then dropped down suddenly due to breakdown.

The initial phase of curve II illustrates that since the voltage is low, the capacity of EAROM to retain or hold data is low. The fact that the voltage suddenly dropped teaches that the number of frequency of writing and erasing of EAROM must be limited.

As has been described so far, the insulation layer on the region where a part of the floating gate and a part of the drain region overlap is removed once according to the present invention. Then a fresh insulation layer is fabricated which enables manufacture of the electrically alterable non-volatile memory having improved characteristics with regard to the capacity to hold information, and the number of permissible writes and erasures.

Thus, the invention having been described in its best embodiment and mode of operation, that which is desired to be protected by Letters Patent is defined by the following claims.

We claim:

1. A method of manufacturing a non-volatile memory device having a part of a floating gate overlapping a part of a drain region formed in a semiconductor substrate, said method comprising the steps of:

(a) forming a first insulation layer on the semiconductor substrate;

(b) introducing impurity atoms into a part of the semiconductor substrate corresponding to the drain region, through the first insulation layer formed on the semiconductor substrate;

(c) removing a portion of the first insulation layer overlapping the drain region on which the floating gate is to be formed, after the impurity atoms have been introduced into the semiconductor substrate, exposing a portion of the semiconductor substrate;

(d) forming a second insulation layer on the exposed portion of the semiconductor substrate; and (e) forming the floating gate over the first insulation layer and on the second insulation layer.

2. A method of manufacturing a non-volatile memory device having a floating gate formed overlapping a portion of a drain formed in a semiconductor substrate of a first conductivity type, said method comprising the steps of:

(a) forming a first insulation layer on the semiconductor substrate;

(b) introducing ions, having a second conductivity type opposite the first conductivity type, through the first insulation layer and into a selected area of the semiconductor substrate;

(c) removing a portion of the first insulation layer overlapping the selected area of the semiconductor substrate on which the floating gate is to be formed after the ions have been introduced into the semiconductor substrate;

(d) forming a second insulation layer on the selected area of the semiconductor substrate;

(e) forming the floating gate overlapping a portion of the selected area of the semiconductor substrate;

(f) forming a third insulation layer on the floating gate;

(g) forming a control gate on the third insulation layer overlapping the floating gate; and (h) forming a source region and the drain region adjacent to the selected area of the semiconductor substrate and separated by the selected area of the semiconductor substrate by introducing ions having the second conductivity type into the semiconductor substrate.

* * * * *

UNITED STATES PATENT AND TRADEMARK OFFICE
CERTIFICATE OF CORRECTION

PATENT NO.   : 4,727,043
DATED        : February 23, 1988
INVENTOR(S)  : TAKASHI MATSUMOTO ET AL.

It is certified that error appears in the above-identified patent and that said Letters Patent is hereby corrected as shown below:

Column 2, line 50,  "," should be --;--.
Column 4, line 7,   "chracteristics" should be --characteristics--;
          line 44,  after "7A" insert --, 7B--.

Signed and Sealed this

Fifth Day of July, 1988

*Attest:*

DONALD J. QUIGG

*Attesting Officer*     *Commissioner of Patents and Trademarks*